United States Patent
Li et al.

(10) Patent No.: US 11,129,271 B2
(45) Date of Patent: Sep. 21, 2021

(54) MOTOR, CIRCUIT BOARD, AND ENGINE COOLING MODULE INCLUDING THE MOTOR

(71) Applicant: Johnson Electric S.A., Murten (CH)

(72) Inventors: Yue Li, Hong Kong (CN); Youqing Xiang, Shenzhen (CN); Xiaojun Yan, Shenzhen (CN); Nan Zheng, Shenzhen (CN); Minghua Xiong, Shenzhen (CN); Yun Chen, Shenzhen (CN)

(73) Assignee: JOHNSON ELECTRIC INTERNATIONAL AG, Murten (CH)

( * ) Notice: Subject to any disclaimer, the term of this patent is extended or adjusted under 35 U.S.C. 154(b) by 465 days.

(21) Appl. No.: 15/980,712

(22) Filed: May 15, 2018

(65) Prior Publication Data

US 2018/0338374 A1  Nov. 22, 2018

(30) Foreign Application Priority Data

May 17, 2017 (CN) .......................... 201710349304.2

(51) Int. Cl.
*H02K 11/33* (2016.01)
*H05K 1/02* (2006.01)
(Continued)

(52) U.S. Cl.
CPC .............. *H05K 1/0204* (2013.01); *F01P 5/04* (2013.01); *F04D 25/06* (2013.01);
(Continued)

(58) Field of Classification Search
CPC ............ H05K 1/02; H05K 1/18; H05K 1/181; H05K 1/0204; H05K 2201/066;
(Continued)

(56) References Cited

U.S. PATENT DOCUMENTS

| 6,830,440 B1 | 12/2004 | Riddoch | |
|---|---|---|---|
| 2003/0047304 A1* | 3/2003 | Kasuga | ................... H02K 11/33 165/185 |

(Continued)

FOREIGN PATENT DOCUMENTS

| CN | 1409888 A | 5/2006 |
| CN | 101556941 A | 9/2011 |
| CN | 102340208 A | 2/2012 |

*Primary Examiner* — Naishadh N Desai
(74) *Attorney, Agent, or Firm* — Millman IP Inc.

(57) ABSTRACT

The present invention relates to a motor, a circuit board and an engine cooling module including the motor. The motor includes a stator and a rotor. The stator includes a control module and a heat sink. The control module includes a circuit board and heat generating electronic components mounted on the circuit board. A bottom surface of the circuit board faces the heat sink. The heat generating electronic components are mounted on a top surface of the circuit board. Metal heat conducting members are embedded inside the circuit board at positions corresponding to the heat generating electronic components, and extend along a thickness direction of the circuit board. The heat generated by the heat generating electronic components is conducted from the top surface of the circuit board to the bottom surface of the circuit board. The present invention improves the heat dissipation effect of the motor.

9 Claims, 5 Drawing Sheets

(51) Int. Cl.
*H02K 9/22* (2006.01)
*H02K 5/22* (2006.01)
*F04D 25/06* (2006.01)
*F01P 5/04* (2006.01)
*F04D 29/58* (2006.01)
*H02K 1/12* (2006.01)
*H02K 1/27* (2006.01)
*H02K 5/04* (2006.01)
*H02K 7/00* (2006.01)
*H02K 9/00* (2006.01)
*H05K 1/18* (2006.01)
*H02K 7/14* (2006.01)

(52) U.S. Cl.
CPC ....... *F04D 25/0606* (2013.01); *F04D 25/068* (2013.01); *F04D 29/5813* (2013.01); *H02K 1/12* (2013.01); *H02K 1/2786* (2013.01); *H02K 5/04* (2013.01); *H02K 5/225* (2013.01); *H02K 7/003* (2013.01); *H02K 9/00* (2013.01); *H02K 9/22* (2013.01); *H02K 11/33* (2016.01); *H05K 1/181* (2013.01); *F01P 2005/046* (2013.01); *H02K 7/14* (2013.01); *H05K 2201/012* (2013.01); *H05K 2201/066* (2013.01)

(58) Field of Classification Search
CPC ............................ H05K 2201/012; F01P 5/04; F01P 2005/046; F04D 25/06; F04D 29/58; F04D 29/5813; F04D 25/068; F04D 25/0606; H02K 1/12; H02K 1/27; H02K 5/04; H02K 7/00; H02K 1/2786; H02K 9/00; H02K 9/22; H02K 11/33; H02K 5/225; H02K 7/003; H02K 7/14
See application file for complete search history.

(56) References Cited

U.S. PATENT DOCUMENTS

2012/0313467 A1* 12/2012 Omae ..................... H02P 27/08
    310/71
2013/0300264 A1* 11/2013 Fujimoto ................. H02K 5/22
    310/68 D

* cited by examiner

MOTOR, CIRCUIT BOARD, AND ENGINE COOLING MODULE INCLUDING THE MOTOR

CROSS REFERENCE TO RELATED APPLICATIONS

This non-provisional patent application claims priority under 35 U.S.C. § 119(a) from Patent Application No. 201710349304.2 filed in The People's Republic of China on May 17, 2017.

FIELD OF THE INVENTION

The present invention relates to electric motors, and in particular to a motor, a circuit board and a cooling module of a car engine including the motor.

BACKGROUND OF THE INVENTION

The control circuit of a motor often includes a power control circuit and a signal control circuit. The power control circuit is configured for controlling on-off of current flow so as to control the stopping and running of the motor. The signal control circuit is configured for controlling the operation or feeding back other information of the motor. In the conventional technology, the power control circuit and the signal control circuit are usually arranged on different circuit boards, which increases the cost of the motor.

Especially, a motor of an engine cooling module, has to work in a hot environment, therefore, the circuit board of the motor is often made of fire retardant material, however, the fire retardant material has the advantages of non-flammable, but also has the disadvantage of poor thermal conductivity.

SUMMARY OF THE INVENTION

Hence there is a desire for a new motor having improved heat dissipation effect.

Accordingly, in one aspect thereof, the present invention provides a motor including a stator and a rotor. The stator includes a control module and a heat sink, the control module includes a circuit board and heat generating electronic components mounted on the circuit board. A bottom surface of the circuit board faces the heat sink, the heat generating electronic components are mounted on a top surface of the circuit board. A plurality of metal heat conducting members is embedded inside the circuit board at positions corresponding to the heat generating electronic components, and the metal heat conducting member extends along a thickness direction of the circuit board so as to conduct heat generated by the heat generating electronic component from the top surface to the bottom surface of the circuit board.

Preferably, metal heat conducting member is a copper block.

Preferably, the metal heat conducting member penetrates the top and bottom surfaces of the circuit board, and one end of the metal heat conducting member is in electronically conductive contact with the heat generating electronic component, the other end of the metal heat conducting member is thermally conductive but not electronically conductive connected to the heat sink.

Preferably, the bottom surface of the circuit board is adhered to the heat sink by a thermally conductive insulating adhesive.

Preferably, the substrate of the circuit board is made of an FR-4 grade material, and the metal heat conducting member is embedded in the substrate.

Preferably, the control module of the motor is mounted on only one circuit board, and the circuit board has a power control circuit and a signal control circuit.

Preferably, the stator includes a stator seat, and the stator seat includes a support seat for supporting the stator core, and the support seat and the heat sink are snap-fitted together and defining a receiving space therebetween for receiving the circuit board.

Preferably, the motor is a permanent magnet outer rotor motor, the stator includes a stator seat, a stator core mounted to the stator seat, stator windings wound around the stator core; the rotor includes a rotating shaft rotatably mounted to the stator seat, a rotor housing having a cup shape fixed to the rotating shaft, and permanent magnets fixed to an inner wall of the rotor housing, an annular side wall of the rotor housing surrounds the stator core, and the permanent magnets are mounted to an inner surface of the annular side wall.

In another aspect thereof, the present invention provides an engine cooling module including a motor, a frame and an impeller. The motor is mounted to the frame for driving the impeller and including a control module and a heat sink, the control module includes a circuit board and heat generating electronic components mounted on the circuit board. A bottom surface of the circuit board faces the heat sink, and the heat generating electronic components mounted on a top surface of the circuit board. A plurality of metal heat conducting members is embedded inside the circuit board at positions corresponding to the heat generating electronic components, and the metal heat conducting member extends along a thickness direction of the circuit board so as to conduct heat generated by the heat generating electronic component from the top surface to the bottom surface of the circuit board.

In another aspect thereof, the present invention provides a circuit board including a substrate, a plurality of heat generating electronic components mounted on the substrate, and a heat sink. The substrate includes a top surface and a bottom surface, the plurality of heat generating electronic components are mounted on the top surface of the substrate, the heat sink is located under the bottom surface of the insulating substrate, a plurality of metal heat conducting members is embedded inside the substrate at a position corresponding to the heat generating electronic component, the metal heat conducting member penetrates the substrate, an end of the heat conducting member facing the heat generating electronic component is in conductive contact with the heat generating electronic component, and the other end of the metal heat conducting member and the heat sink are thermally conductive but not electrically conductive.

The present invention improves the heat dissipation effect of the circuit board, so that the heat dissipation effect of the motor can be improved.

BRIEF DESCRIPTION OF THE DRAWINGS

A preferred embodiment of the invention will now be described, by way of example only, with reference to figures of the accompanying drawings. In the figures, identical structures, elements or parts that appear in more than one figure are generally labeled with a same reference numeral in all the figures in which they appear. Dimensions of components and features shown in the figures are generally chosen for convenience and clarity of presentation and are not necessarily shown to scale. The figures are listed below.

DETAILED DESCRIPTION OF THE PREFERRED EMBODIMENTS

Embodiments of the present invention will be described in greater detail with reference to the drawings. It should be noted that the figures are illustrative rather than limiting. The figures are not drawn to scale, do not illustrate every aspect of the described embodiments, and do not limit the scope of the present disclosure. Unless otherwise specified, all technical and scientific terms used in this disclosure have the ordinary meaning as commonly understood by people skilled in the art.

Figure 1:
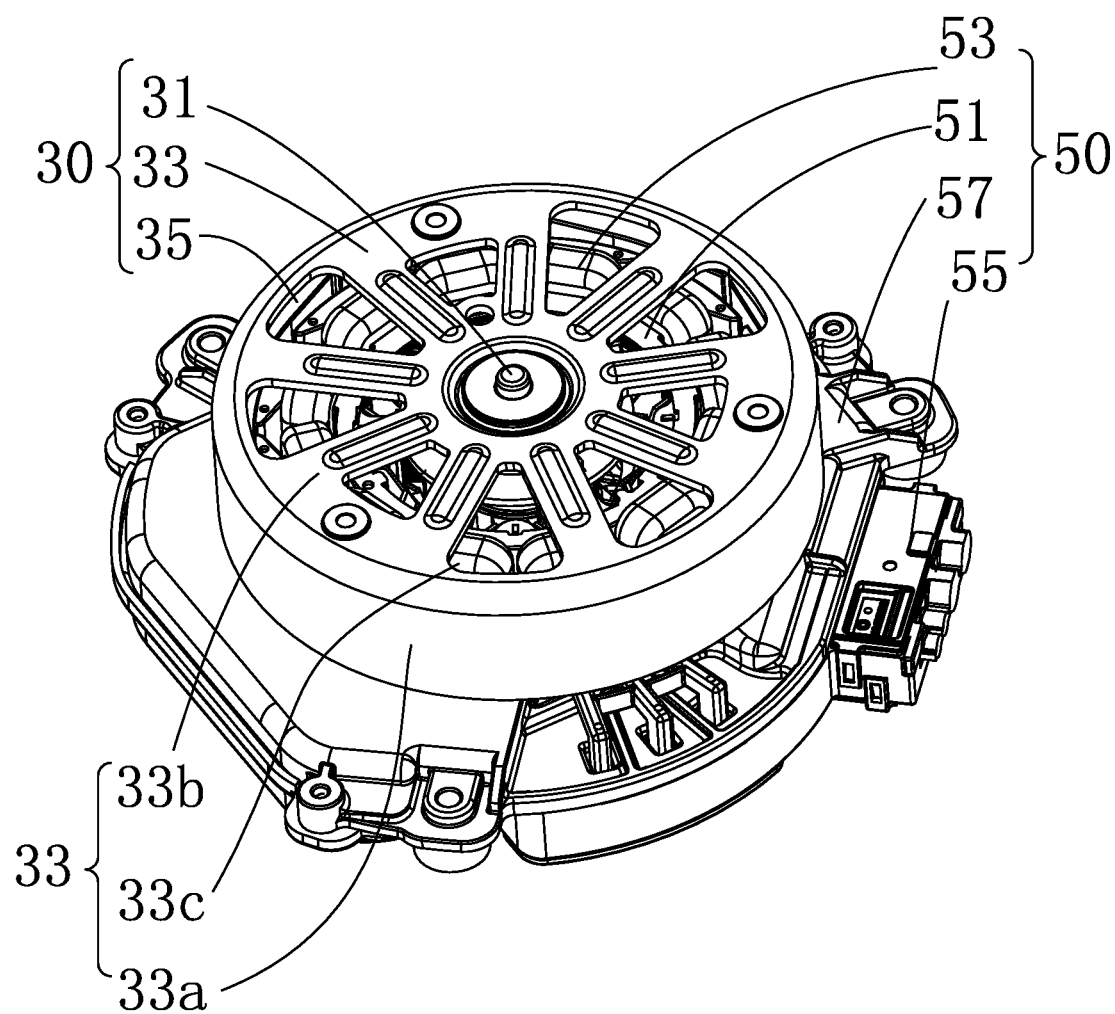
FIG. 1 is a schematic diagram of a motor according to an embodiment of the present invention.

Referring to FIG. 1, a motor 100 in accordance with an embodiment of the present invention is a permanent magnet brushless outer rotor motor, which includes a rotor 30 and a stator 50.

The stator 50 includes a stator core 51 made of magnetic material, stator windings 53 wound around the stator core 51, a connector 55 for supplying power to the stator windings 53, a stator seat 57 for supporting the stator core 51, a heat sink 71 mounted to the stator seat 57, and a control module. The heat sink 71 is made of metal heat conductive material such as copper or aluminum. The connector 55 is mounted to the stator seat 57 for connection to an external power source (not shown).

The rotor 30 includes a rotating shaft 31, a rotor housing 33 having a cup shape fixed to the rotating shaft 31, and a plurality of permanent magnets 35 mounted on an inner wall of the rotor housing 33. The rotor housing 33 includes an annular side wall 33a and a bottom portion 33b located at an axial end of the annular side wall 33a. The bottom portion 33b is fixed to the rotating shaft 31 so as to rotate with the rotating shaft 31. The annular side wall 33a surrounds and rotates around the shaft 31. The permanent magnet 35 is attached to an inner circumferential surface of the annular side wall 33a. In this embodiment, a plurality of substantially fan-shaped through holes 33c is defined in the bottom portion 33b and distributed around the rotating shaft 31, so that outside air can enter the interior of the motor 100 to cool the stator core 51 and the stator windings 53 to improve cooling effect of the motor 100. The bottom portion 33b of the rotor housing 33 forms a plurality of mounting positions for fixedly mounting the rotor 30 to an impeller 220 (see FIG. 7) so that the rotor 30 can drive the impeller to rotate.

Figure 2:
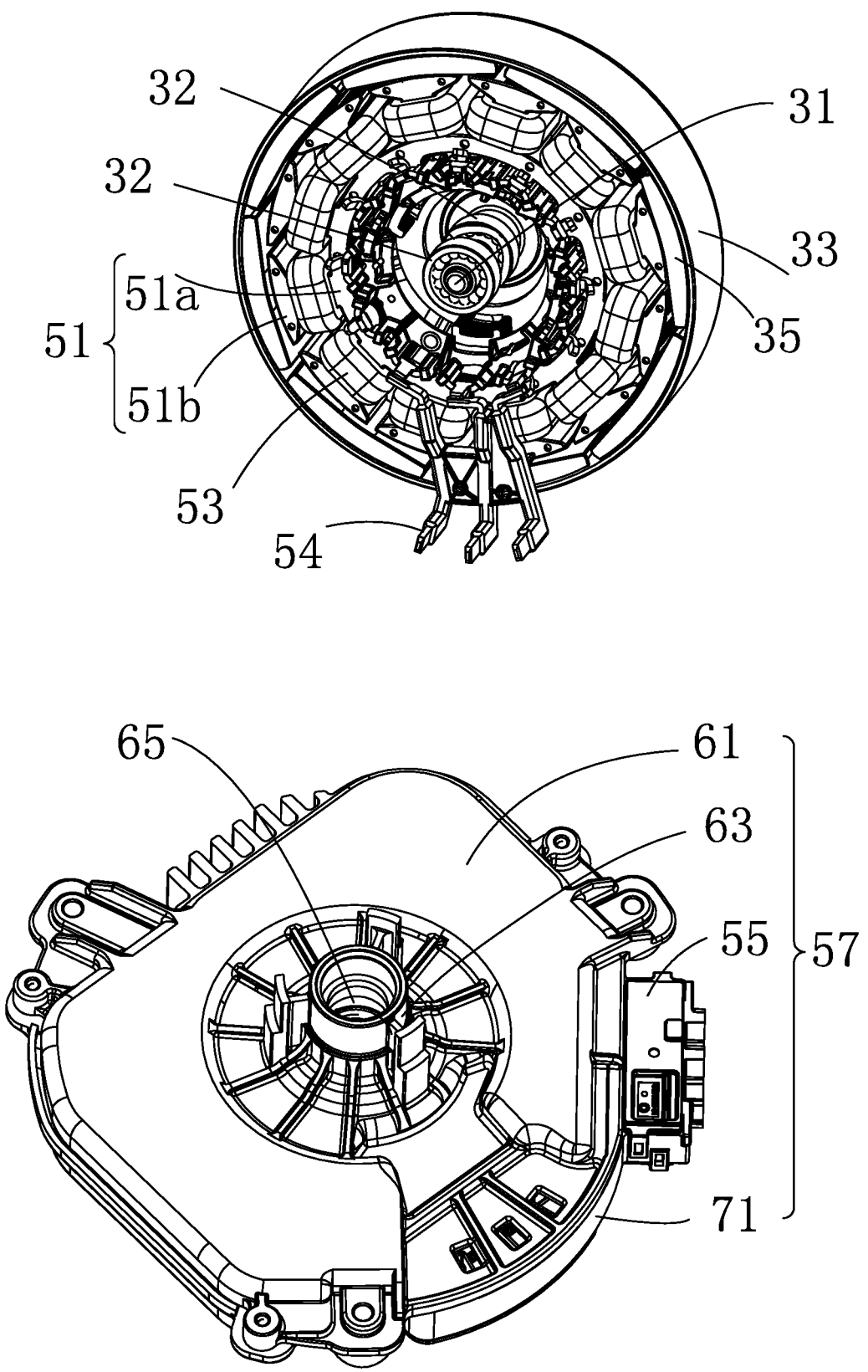
FIG. 2 shows the internal structure of the motor of FIG. 1.

Referring to FIG. 2, the rotation shaft 31 is rotatably mounted to the stator seat 57 through two bearings 32. The stator seat 57 includes a cylindrical supporting column 63. Two bearing positions 65 are formed in the supporting column 63 for mounting corresponding bearings 32. In this manner, the rotor 31 can rotate relative to the stator seat 57.

The stator core 51 includes an annular yoke portion 51a, and a plurality of stator teeth 51b extending outwardly from the annular yoke portion 51a. The stator windings 53 are wound around the stator teeth 51b. The stator core 51 and stator windings 53 are fixedly mounted to the stator seat 57.

The stator seat 57 includes a support seat 61 and a heat sink 71 snap-fitted with the support seat 61, and the supporting column 63 is disposed on the support seat 61.

Figure 3:
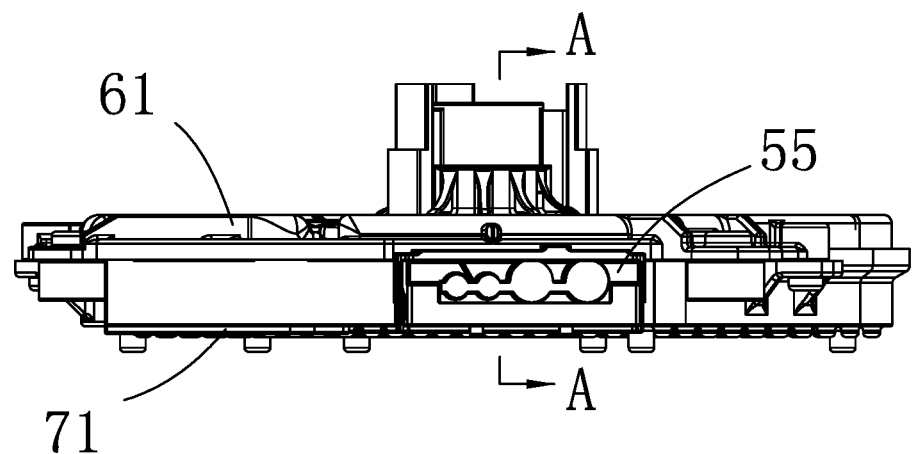
FIG. 3 is a schematic side view of the stator seat of the motor of FIG. 1.
Figure 4:
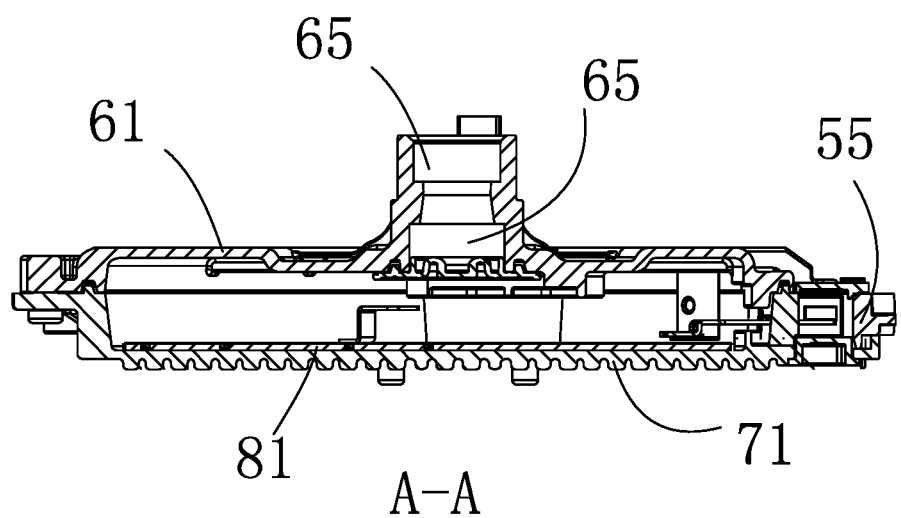
FIG. 4 is a longitudinal sectional view of the stator seat along the line A-A of FIG. 3.
Figure 5:
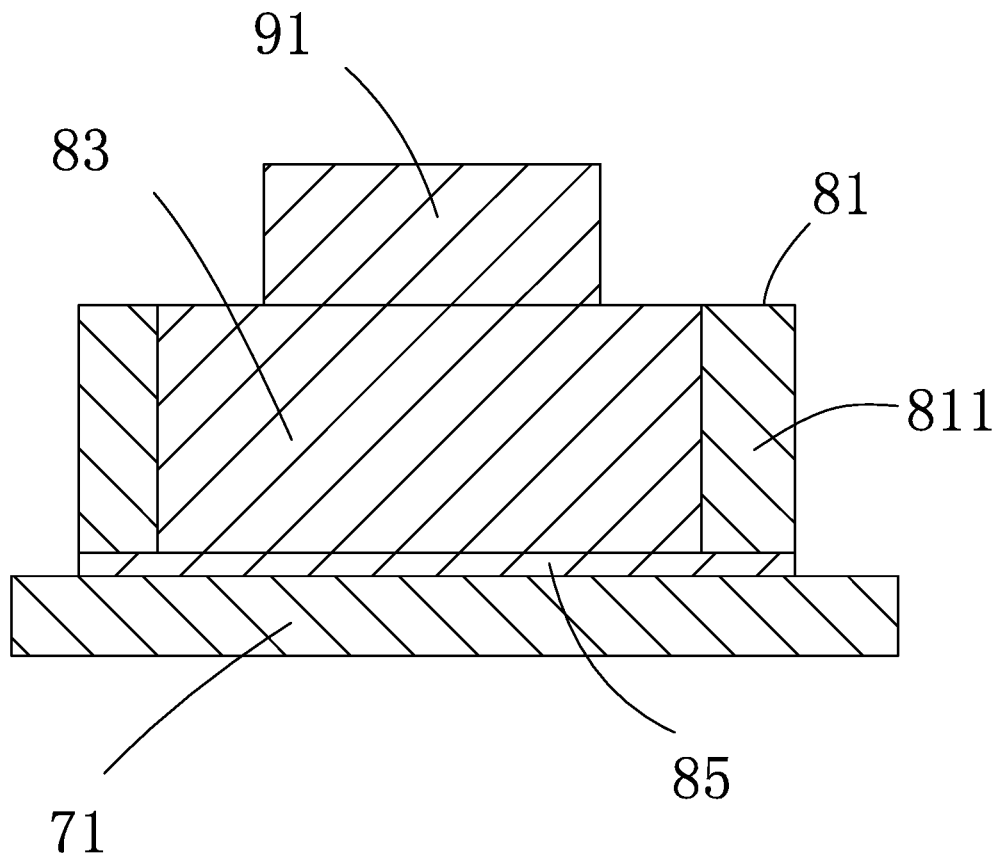
FIG. 5 is a schematic cross-sectional view of a circuit board and a heat sink of the motor of FIG. 1.

Referring to FIGS. 3-5, the control module includes a circuit board 81 and a plurality of heat generating electronic components 91 mounted on the circuit board 81. In this embodiment, the support seat 61 and the heat sink 71 respectively serve as an upper shell and a lower shell of the stator seat 57. The support seat 61 and the heat sink 71 are buckled together, and a receiving cavity is formed therein for accommodating the circuit board 81 and the heat generating electronic components 91. The connector 55 is mounted to the circuit board 81 and electrically connected to the heat generating electronic elements on the circuit board 81.

Referring to FIG. 5, a bottom surface of the circuit board 81 abuts against the heat sink 71 or is adhered to the heat sink 71 by a thermally conductive insulating adhesive 85 to facilitate heat dissipation, and a number of electronic components 91, such as metal-oxide semiconductor field effect transistors (MOSFETs), is mounted on a top surface of the circuit board 81. It can be understood that the components 91 will generate heat when operating and become a heat source. A substrate 811 of the circuit board 81 is made of fire retardant material, for example, FR4 material.

In order to improve the heat dissipation effect, metal heat conducting members are embedded in the substrate 811 of the circuit board 81. In this embodiment, the metal heat conducting member is a copper block 83, and the copper block 83 extends along the thickness direction of the circuit board 81. Preferably, the copper block 83 penetrates the top and bottom surfaces of the circuit board 81, the heat generated by the heat generating electronic component 91 is rapidly transferred from the top surface to the bottom surface of the circuit board 81 and dissipated through the heat sink 71. The embedded metal heat conducting member can effectively improve the thermal conductivity of the circuit board 81 along its thickness direction. Preferably, the position of the copper block 83 faces the heat generating electronic component 91. The top surface of the copper block 83 is in electrically conductive contact with the heat generating electronic component 91, and the bottom surface of the copper block 83 is not in contact with the heat sink 71. Specifically, a heat conducting pin of the heat generating electronic component 91 such as a thermal pad of a MOSFET may be directly soldered to the copper block 83, so that the heat generated by the MOSFET can be quickly transferred to the copper block 83; more preferably, the area of the copper block 83 facing the component 91 is larger than the area of the component 91 so as to receive and transfer as much heat as possible from the component 91. Preferably, one MOSFET can be provided with a metal heat conducting member 83 correspondingly. Understandably, if a plurality of thermal pads of MOSFETs is connected together, the plurality of MOSFETs can share one metal heat conduction member.

The bottom surface of the circuit board 81 is attached to the heat sink 71 through a thermally conductive insulating adhesive 85. The thermally conductive insulating adhesive 85 fills the gap between the circuit board 81 and the heat sink 71 as much as possible, so that the heat conduction between the circuit board 81 and the heat sink 71 is improved. The thermally conductive insulating adhesive 85 is located between the metal heat conducting member 83 and the heat sink 71 so that the metal heat conducting member 83 is not in contact with the heat sink 71, and electrically insulating the metal heat conducting member 83 and the heat sink 71.

Preferably, the motor 100 has only one circuit board 81, thereby simplifying the structure and reducing the assembly cost. The circuit board 81 can integrate power management and signal transduction. Accordingly, the connector 55 includes terminals connected to the power source and terminals connected to the signal source.

Figure 6:
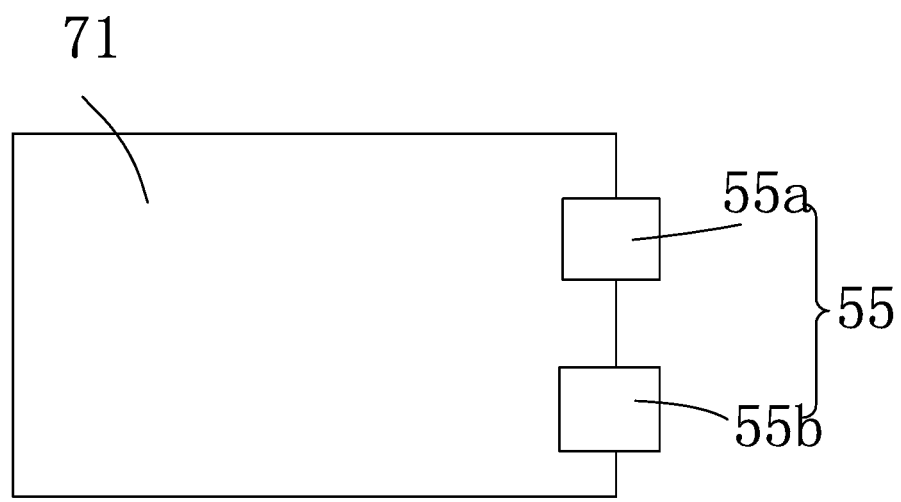
FIG. 6 is a schematic view of a circuit board and a connector used in a motor according to another embodiment of the present invention.

Referring to FIG. 6, alternatively, the circuit board 81 may be connected to two connectors, ie, a power connector 55a and a signal connector 55b.

Figure 7:
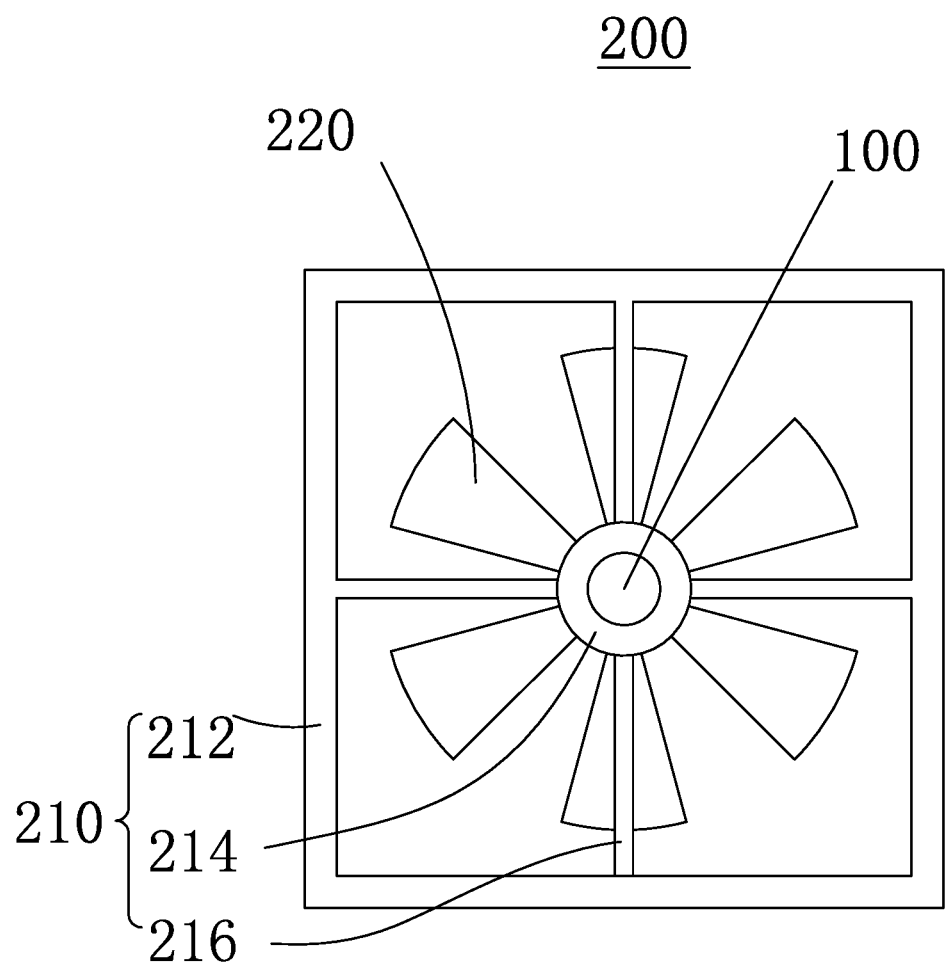
FIG. 7 is a schematic diagram of a cooling module of a car engine according to another embodiment of the present invention.

Referring to FIG. 7, a cooling module 200 of a car engine according to another embodiment of the present invention is disclosed. The motor of the present invention is applied to the cooling module 200. The engine cooling module 200 includes a frame 210, an impeller 220, and the motor 100. The frame 210 includes a rectangular or circular outer frame 212, an inner frame 214 disposed at the center of the outer frame 212, and a plurality of supporting portions 216 connected between the outer frame 212 and the inner frame 214. The motor 100 is mounted to the inner frame 214 and is configured to drive the impeller 220. Due to the application of the motor 100 of the present invention, the engine cooling module 200 has good heat dissipation, good cooling effect and long service life.

Referring to FIG. 5, a circuit board according to another embodiment of the present invention includes a substrate 811, a plurality of heat generating electronic components 91 mounted on the substrate 811, and a heat sink 71. The substrate 811 includes a top surface and a bottom surface. The heat generating electronic components 91 are mounted on the top surface of the insulating substrate 811. The heat sink 71 is located under the bottom surface of the insulating substrate 811. Inside the insulating substrate 811, metal heat conducting members 83 are embedded under positions where the heat generating electronic components 91 are located. The metal heat conducting member 83 penetrates the insulating substrate 811, and one end of the metal heat conducting member 83 is in conductive contact with the heat generating electronic component 91. The other end of the metal heat conducting member 83 is thermally but non-electrically connected to the heat sink 71, and the heat generated by the heat generating electronic component 91 is transferred to the heat sink 71. The bottom surface of the insulating substrate 811 is adhered to the heat sink 71 by a thermally conductive insulating adhesive 85. The thermally conductive insulating adhesive 85 is located between the metal heat conducting member 83 and the heat sink 71 to electrically insulate the metal heat conducting member 83 and the heat sink 71 so that a thermally conductive and non-electrical conductive contact is formed between the metal heat conducting member 83 and the heat sink 71. The control circuit board 81 quickly conducts the heat generated by the heat generating electronic components 91 to the bottom surface of the insulating substrate 811 through the metal heat conducting member 83 and dissipates heat through the heat sink 71, so that the heat dissipation and the service life of the circuit board is improved.

In the description and claims of the present application, each of the verbs "comprise", "include", "contain" and "have", and variations thereof, are used in an inclusive sense, to specify the presence of the stated item or feature but do not preclude the presence of additional items or features.

It is appreciated that certain features of the invention, which are, for clarity, described in the context of separate embodiments, may also be provided in combination in a single embodiment. Conversely, various features of the invention which are, for brevity, described in the context of a single embodiment, may also be provided separately or in any suitable sub-combination.

The embodiments described above are provided by way of example only, and various other modifications will be apparent to persons skilled in the field without departing from the scope of the invention as defined by the appended claims.

The invention claimed is:

1. A motor comprising a stator and a rotor, the stator comprising a control module and a heat sink, the control module comprising a circuit board and heat generating electronic components mounted on the circuit board, a bottom surface of the circuit board facing the heat sink, the heat generating electronic components mounted on a top surface of the circuit board, wherein a plurality of metal heat conducting members is embedded inside the circuit board at positions corresponding to the heat generating electronic components, and the plurality of metal heat conducting members extend along a thickness direction of the circuit board so as to conduct heat generated by the heat generating electronic component from the top surface to the bottom surface of the circuit board.

2. The motor according to claim 1, wherein any of the plurality of metal heat conducting members is a copper block.

3. The motor according to claim 1, wherein the plurality of metal heat conducting members penetrate the top and bottom surfaces of the circuit board, and one end of each of the plurality of metal heat conducting members is in electronically conductive contact with the heat generating electronic component, the other end of each of the plurality of metal heat conducting members is thermally conductive but not electronically conductive connected to the heat sink.

4. The motor according to claim 1, wherein the bottom surface of the circuit board is adhered to the heat sink by a thermally conductive insulating adhesive.

5. The motor according to claim 1, wherein the substrate of the circuit board is made of an FR-4 grade material, and the plurality of metal heat conducting members are embedded in the substrate.

6. The motor according to claim 1, wherein the control module of the motor is mounted on only one circuit board, and the circuit board has a power control circuit and a signal control circuit.

7. The motor according to claim 1, wherein the stator comprises a stator seat, and the stator seat comprises a support seat for supporting the stator core, and the support seat and the heat sink are snap-fitted together and defining a receiving space therebetween for receiving the circuit board.

8. The motor according to claim 1, wherein the motor is a permanent magnet outer rotor motor, the stator comprises a stator seat, a stator core mounted to the stator seat, stator windings wound around the stator core; the rotor comprises a rotating shaft rotatably mounted to the stator seat, a rotor housing having a cup shape fixed to the rotating shaft, and permanent magnets fixed to an inner wall of the rotor housing, an annular side wall of the rotor housing surrounds the stator core, and the permanent magnets are mounted to an inner surface of the annular side wall.

9. An engine cooling module comprising the motor according to claim 1, a frame and an impeller, the motor being mounted to the frame for driving the impeller.

\* \* \* \* \*